Aug. 19, 1969 W. HEINLEIN 3,462,696

PARAMETRIC AMPLIFIER USING DIODE SELF-RESONANCE FOR IDLE CIRCUIT

Original Filed April 22, 1963 2 Sheets-Sheet 1

Aug. 19, 1969 W. HEINLEIN 3,462,696

PARAMETRIC AMPLIFIER USING DIODE SELF-RESONANCE FOR IDLE CIRCUIT

Original Filed April 22, 1963 2 Sheets-Sheet 2

United States Patent Office 3,462,696

Patented Aug. 19, 1969

3,462,696

PARAMETRIC AMPLIFIER USING DIODE SELF-RESONANCE FOR IDLE CIRCUIT

Walter Heinlein, Munich, Germany, assignor to Siemens Aktiengesellschaft, Munich, Germany, a corporation of Germany Continuation of application Ser. No. 274,527, Apr. 22, 1963. This application Feb. 6, 1967, Ser. No. 614,363

Claims priority, application Germany, Apr. 25, 1962, S 79,157

The portion of the term of the patent subsequent to Dec. 12, 1984, has been disclaimed and dedicated to the Public Int. Cl. H03f 7/00

U.S. Cl. 330—4.9 7 Claims

ABSTRACT OF THE DISCLOSURE

A parametric amplifier having a cavity-type diode presenting an average barrier layer capacitance $Cm$, an intrinsic inductivity $Lo$, and a housing capacitance $Cg$ such that its upper intrinsic resonance frequency equals the lower intrinsic resonance frequency multiplied by $$\sqrt{1+\frac{Cm}{Cg}}$$

Figure 1:
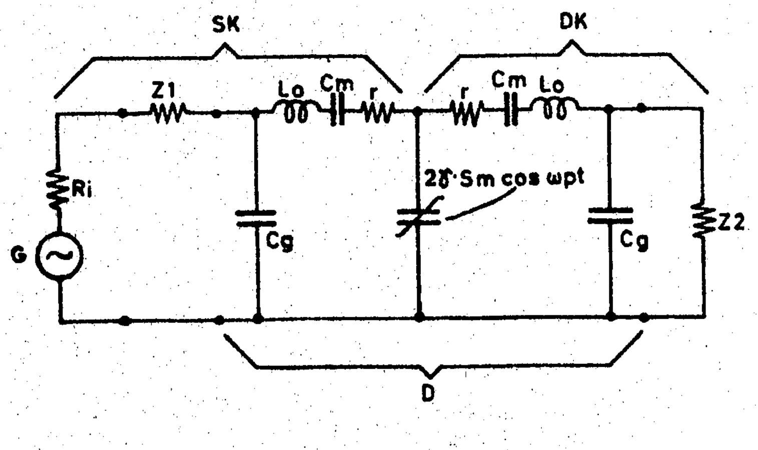

the difference frequency circuit of the amplifier consisting only of $Cm$, $Lo$, and $Cg$ in series, and receiving energy at an average difference frequency substantially equal to the diode upper intrinsic resonance frequency.

The invention disclosed herein relates to an amplifier circuit with a nonlinear reactance, and is particularly concerned with a device for amplifying very short electromagnetic waves, comprising a reactance modulator having a cavity-type diode as a nonlinear reactance, to which is conducted the signal energy which is to be amplified and also the energy of a pump oscillator.

Devices of this kind have become known as parametric amplifiers. The operating temperature at the noise level is relatively low and such amplifiers are therefore particularly well adapted for use as input circuits for highly sensitive receiver arrangements.

Parametric amplifiers, such as described, for example, in proceedings of the IRE, July 1958, pages 1301 to 1305, make use of the nonlinear properties of a reactance which advantageously consists, for example, of a cavity-type diode operating in the barrier range. The frequency of the energy conducted from the pump oscillator to the reactance is as a rule higher than the signal frequency. Owing to the nonlinearity of the reactance, there appear side bands lying above and below the pump frequency. An attenuation at the signal input is avoided by an active component contained in the termination of the circuit for the difference frequency lying below the pump oscillation. The cavity-type diode operates then like a negative resistance and can be utilized, in connection with a circulator, for the amplification of waves.

Parametric amplifiers, insofar as they are not constructed as amplifiers for travelling waves, require for their operation a tuned circuit respectively for the signal frequency currents and for the difference frequency currents. These tuned circuits must be as wide-band as possible if the amplifier band width as such is to be wide. The obtainable band width of the circuits is in practice strongly affected by the parasitic reactances of the cavity-type diode.

The object underlying the invention is to considerably improve a parametric amplifier of the initially indicated type, among others, with respect to the above indicated difficulties.

According to the invention, this object is realized, in connection with a device for amplifying very short electromagnetic waves, having a reactance modulator including a cavity-type diode as a nonlinear reactance, to which is conducted the signal frequency which is to be amplified and also the energy of a pump oscillator, and wherein the resonance circuit for the difference frequency oscillation formed by the mixing of the signal frequency with the pump energy is substantially determined by the parasitic reactances of the cavity-type diode, by an arrangement wherein the difference frequency corresponds to the respective intrinsic resonance frequency of the cavity-type diode, which is formed by the average barrier layer capacitance and the series circuit of intrinsic inductivity and the housing capacitance of the diode, and wherein the exterior circuit of the cavity-type diode represents at least approximately no-load for the difference frequency.

The invention proceeds from the recognition of the fact that the maximum band width which can be realized in connection with a parametric amplifier having a cavity-type diode, occurs at the intrinsic frequency of the diode and is determined by the path resistance and the intrinsic inductivity of the diode.

Further details of the invention will appear from the description which is rendered below with reference to the accompanying drawings.

Figure 2:
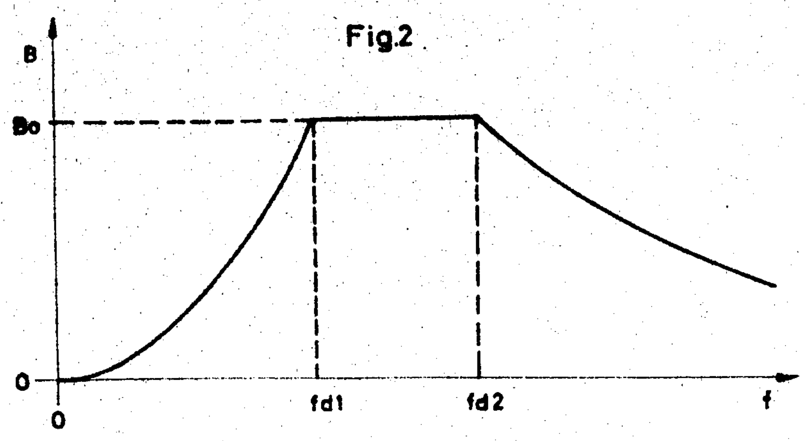
Figure 3:
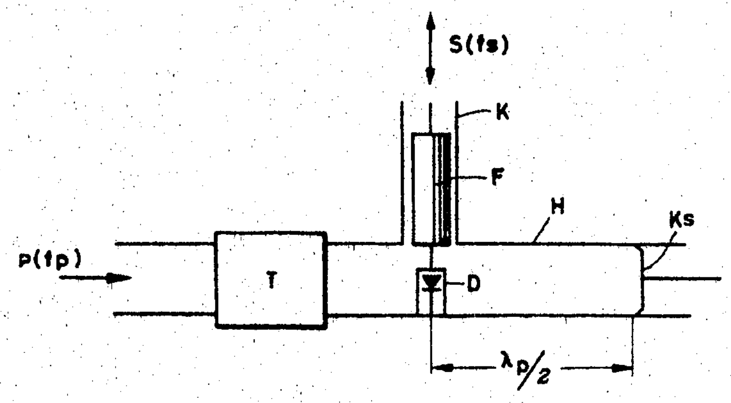
Figure 4:
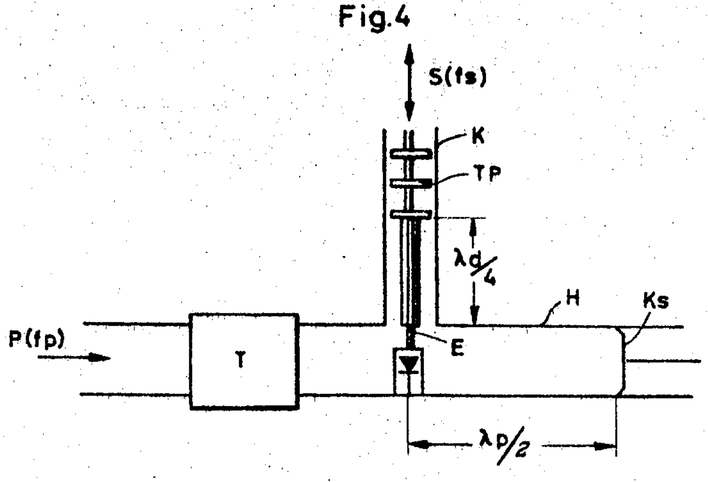

FIG. 1 represents the substitution or equivalence circuit of a parametric amplifier equipped with a cavity-type diode;

FIG. 2 indicates the band width B of the difference frequency oscillator circuit plotted with respect to the resonance frequency $f$; and FIGS. 3 and 4 illustrate embodiments according to the invention.

Referring now to FIG. 1, the cavity-type diode D has the average barrier layer capacitance $Cm$, the intrinsic inductivity $Lo$, the path resistance $r$ and the housing capacitance $Cg$. The triggering of the barrier layer by the pump voltage is given by the alternate elastance $2\gamma \cdot Sm \cdot \cos \omega pt$, wherein $\gamma$ is the degree of modulation, $Sm=1/Cm$ the average barrier layer elastance, and $\omega p$ the circuit frequency of the pump voltage. The average barrier layer capacitance $Cm$ the intrinsic inductivity $Lo$, the path resistance $r$, and the housing capacitance $Cg$ of the diode D are in the equivalence circuit represented twice since they are operative for the signal circuit SK as well as for the difference frequency oscillation circuit DK. The signal circuit SK includes in addition to the signal generator G and its internal resistance $Ri$, an impedance Z1 which serves for tuning. The difference frequency oscillation circuit DK contains similarly an apparent reactance Z2 which is disposed in parallel with the housing capacitance $Cg$ and represents the external termination of this circuit. The impedance Z2 generally has an active component which loads the difference frequency circuit in addition to the path resistance $r$, and a reactance component which is required for tuning the difference frequency oscillation circuit to resonance. Z2 is with consideration of a low noise level temperature in most cases made in the form of a pure reactance.

The greatest difficulties are as a rule experienced in the realization of a great band width of the difference frequency oscillation circuit. As noted before, FIG. 2 indicates the band width B of the difference frequency oscillation circuit plotted with respect to the resonance frequency $f$. The external terminal impedance Z2 with the aid of which is effected the tuning to the respective resonance frequency, represents thereby a pure reactance. It will be seen from the diagram that the band width B increases initially up to a band width $Bo$ at the resonance frequency $fd1$. Z2 is inductive in this range. There is no further increase in band width in the range between the resonance frequency $fd1$ and the resonance frequency $fd2$, the band width remaining constant owing to the intrinsic inductivity $Lo$ of the diode. Z2 is in this range capacitive. In the region above the resonance frequency $fd2$, in which Z2 is again inductive, the band width falls to small values owing to the action of the housing capacitance.

The resonance frequencies $fd1$ and $fd2$, in the range of which the band width of the difference frequency oscillation circuit has a maximum, the value of which is calculated from the path resistance $r$ and the intrinsic inductivity $Lo$, to $$Bo=\frac{r}{2\cdot Lo}$$

are intrinsic resonances of the cavity-type diode, namely
$Z2=\infty$ for the intrinsic resonance frequency $$fd1=\frac{1}{2\pi\cdot\sqrt{Cm\cdot Lo'}}$$

and with
Z2=for the intrinsic resonance frequency $$fd2=fd1\cdot\sqrt{1+\frac{Cm}{Cg}}$$

Parametric amplifiers which utilize the lower intrinsic resonance frequency $fd1$, are known. The short circuit of the housing capacitance $Cg$, which is required for this frequency, is thereby realized by means of a bridge circuit which contains a further cavity-type diode.

As contrasted with this situation, the invention makes use of the upper intrinsic resonance frequency $fd2$. The great and immediately apparent advantage resides in that only one diode is required. The intrinsic resonance frequency $fd2$ represents the highest difference frequency at which it is still possible to realize the band width $Bo$ which can be obtained as a maximum. Since the noise level temperature of a parametric amplifier is the lower the greater the ratio of the difference frequency $fd$ to the signal frequency $fs$, the invention results in the further advantage of obtaining the greatest possible band width with a minimum noise level temperature. The factor $$\sqrt{1+\frac{Cm}{Cg}}$$

by which the intrinsic resonance frequency $fd2$ is higher than the intrinsic resonance frequency $fd1$, lies in the case of commercially available diodes on the order of magnitude 1, 4 . . . 2.

In a particularly advantageous embodiment of the invention, the cavity-type diode is disposed inside of a wave guide serving for extending the pump energy, the limit frequency of such wave guide lying above the difference frequency. The signal frequency is conducted to the cavity-type diode over a wave conductor which is at least in part constructed as a filter, such filter representing at its termination in the wave guide no-load for the difference frequency and a resistance for the pump frequency which is as low as possible.

The wave conductor which transmits the signal energy may be, for example, a coaxial conductor with a transition from its termination in the wave guide, to a low pass filter, so as to satisfy the no-load requirement with respect to the difference frequency oscillation, in a spacing of one-fourth wave length $\lambda d$ of the difference frequency oscillation or an integral multiple thereof, the limit frequency of the low pass filter lying above the highest signal frequency but below the lowest frequency of the difference frequency band. The characteristic wave impedance of the coaxial line section between the termination in the wave guide and the low pass filter is so dimensioned, that the signal source is matched to the negative resistance of the cavity-type diode.

A variable shunt in the form of a shunt slide is best adapted to serve as a termination of the wave guide in the direction of propagation of the pump waves. Since the current control of the cavity-type diode admits greater modulation degrees than the voltage control, it is furthermore appropriate to arrange the diode in a current bulge of the pump wave. This is in simple manner effected by selecting the spacing between the location of the cavity-type diode and the location of the shunt plane of the shunt slide, according to one-half of the wave guide length $\lambda p$ of the pump oscillation.

As contrasted with known parametric amplifiers constructed in the manner of wave guides, the wave guide in the present invention does not furnish any contribution to the difference frequency oscillation circuit. This fortunate circumstance can be utilized, in accordance with another feature of the invention, for effecting savings with respect to the pump power, with the aid of a transformation member which matches the path resistance of the diode to the pump oscillator. The transformation member is inserted at an appropriate place in the wave guide which conducts the pump energy.

The invention will now be explained more in detail with reference to embodiments shown in FIGS. 3 and 4 of the drawings.

The amplifier circuit shown in FIG. 3 comprises a wave guide H within which is disposed a cavity-type diode D, known as a varactor, representing the nonlinear reactance. The wave guide, the limit frequency of which lies above the difference frequency, is at its right hand end terminated by a shunt slide $Ks$. The pump energy P is conducted to the cavity-type diode D from the left over the transformation member T, and the signal S which is to be amplified is supplied over a coaxial line K. The latter is in the region of its termination in the wave guide H constructed as a filter F which represents no-load with respect to the difference frequency oscillation and with respect to the pump frequency $fp$ a resistance which is as low as possible. The transformation member T is so dimensioned and disposed in the wave guide, that the path resistance of the diode is matched to the internal resistance of the pump oscillator transformed at the diode. The shunt plane of the shunt slide $Ks$ is appropriately determined so that the diode is disposed at the current bulge of the pump wave. In the present embodiment, the spacing amounts to one-half of a waveguide wavelength $\lambda p$ of the pump oscillation. It is of course understood that the spacing may amount to an integral multiple thereof. As already mentioned, the current control of the diode D has as compared with the voltage control, the advantage that it permits greater latitude.

The pump frequency $fp$ is, with given average signal frequency $fs$, so selected that the average difference frequency corresponds to the upper intrinsic resonance frequency $fd2$ of the diode D. The difference frequency oscillation circuit is in the invention, according to the foregoing explanations, limted explicitly to the cavity-type diode D as such and is, more specifically, formed by the average barrier layer capacitance and the series circuit of the intrinsic inductivity and the housing capacitance. The external circuit (wave guide H and coaxial line K) is at the difference frequency completely decoupled from the diode, since the wave guide limit frequency above the difference frequency is determined, and since the coaxial line K represents no-load for the difference frequency.

A particularly advantageous embodiment including a filter is shown in FIG. 4, which is constructed in a manner similar to the amplifier according to FIG. 3. The coaxial line K passes, in a spacing of one-fourth of an average wavelength $\lambda d$ of the difference frequency oscillations, from the wave guide input to a low pass filter TP the limit frequency of which is above the highest signal frequency but below the lowest frequency of the difference frequency band. Moreover, the wave resistance of this coaxial line section with the length $\lambda d/4$, is selected so that the signal generator is matched to the negative resistance of the diode D. The constriction E of the inner conductor of the coaxial line, at the end near the diode, serves for the tuning of the signal circuit. Difference frequency oscillations entering into the coaxial line K encounter at the low pass filter input a shunt. The coaxial line section with the length $\lambda d/4$ accordingly forms for the difference frequency a spur line which is at one end short circuited and the other open end no-load. The low pass filter also represents a shunt for the pump frequency. The frequency of the pump wave is considerably higher than the difference frequency. Accordingly, the coaxial line section forms for the frequency of the pump wave a capacitive reactance resistance which is the lower the better the wave length of the pump oscillation in the coaxial line is matched to the half-wavelength $\lambda d$ of the difference frequency oscillation. The constriction E which represents an inductivity can in a given case be utilized to reduce this capacitive reactance resistance to a negligible value.

Changes may be made within the scope and spirit of the appended claims which define what is believed to be new and desired to have protected by Letters Patent.

The invention claimed is:

1. A device for amplifying very short electromagnetic waves comprising a diode having a controllable capacitive reactance and presenting an average barrier layer capacitance $Cm$, an intrinsic inductivity $Lo$, and a housing capacitance $Cg$, such that a lower intrinsic resonance frequency $fd1$ of said diode equals $$\frac{1}{2\pi\sqrt{Cm\cdot Lo}}$$

and an upper intrinsic resonance frequency $fd2$ of said diode equals $$fd1\cdot\sqrt{1+\frac{Cm}{Cg}}$$

wave conductor means for supplying signal energy to said diode with an average signal frequency $fs$ and for supplying pump energy to said diode at a pump frequency $fp$, such that $fp$ minus $fs$ equal $fd2$, and a difference frequency circuit for the difference frequency oscillations resulting from the mixing of the signal energy with the pump energy, said difference frequency circuit consisting only of said average barrier layer capacitance $Cm$ and the intrinsic inductivity $Lo$ and the housing capacitance $Cg$ in series, and receiving energy from said wave conductor means at said average signal frequency $fs$ and at said pump frequency $fp$ to provide an average difference frequency of $fp$ minus $fs$ substantially equal to the diode upper intrinsic resonance frequency $fd2$.

2. A device according to claim 1 where the wave conductor means comprises a hollow waveguide having said diode therein, said hollow wave guide supplying said pump energy to said diode and having a limit frequency above said upper intrinsic resonance frequency $fd2$, and where the wave conductor means further comprises a signal energy conductor including a filter representing substantially no load at the upper intrinsic resonance frequency $fd2$.

3. A device according to claim 2 where the filter is arranged to present a relatively low resistance with respect to the pump frequency $fp$.

4. A device according to claim 3 where the signal energy conductor is a coaxial conductor and the filter is a coaxial conductor filter which transmits to the diode signal energy having a signal frequency range including a highest signal frequency so as to generate a difference frequency range of difference frequency signals having a corresponding lowest difference frequency, said coaxial conductor filter having a limit frequency above the highest signal frequency but below the lowest difference frequency, the filter being arranged at a spacing from the termination of the coaxial conductor in the waveguide which amounts to one-fourth of an average wavelength of the difference frequency oscillations or an integral multiple thereof, a signal source having a predetermined internal resistance coupled to said coaxial conductor, and the wave resistance of the coaxial conductor section lying between the termination in said wave guide and said filter, being dimensioned so that the signal source is matched to the negative resistance of the diode.

5. A device according to claim 2 where the hollow wave guide has a short circuit slide for terminating the wave guide beyond the diode as seen in the direction of propagation of the pump energy.

6. A device according to claim 5, where the short circuit slide is arranged with its short circuit plane displaced from the diode by a distance of one-half of the hollow wave guide wavelength of the pump frequency or an integral multiple thereof.

7. A device according to claim 2 where a pump oscillator supplies pump energy to the wave guide, and a transformation member is interposed between the pump oscillator and the diode for matching the path resistance of the diode to the pump oscillator.

OTHER REFERENCES

Varactor Applications, Penfield et al., The M.I.T. Press, 1962 (pp. 70–71).

Semiconductor-Diode Parametric Amplifiers, Blackwell et al., Prentice-Hall, Inc., 1961 (pp. 128–131).

JOHN KOMINSKI, Primary Examiner

DARWIN R. HOSTETTER, Assistant Examiner

U.S. Cl. X.R.

330—34, 56; 333—82